US008013981B2

(12) United States Patent
Neerhof et al.

(10) Patent No.: US 8,013,981 B2
(45) Date of Patent: Sep. 6, 2011

(54) LITHOGRAPHIC APPARATUS AND DEVICE MANUFACTURING METHOD

(75) Inventors: Hendrik Antony Johannes Neerhof, Eindhoven (NL); Cornelis Maria Zwaans, Herpen (NL); Ernst Eduart Vrolijks, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 584 days.

(21) Appl. No.: 11/812,091

(22) Filed: Jun. 14, 2007

(65) Prior Publication Data

US 2008/0309912 A1 Dec. 18, 2008

(51) Int. Cl.
*G03B 27/32* (2006.01)
*G03B 27/42* (2006.01)
*G03B 27/58* (2006.01)
*H01L 21/683* (2006.01)

(52) U.S. Cl. ............... 355/72; 355/53; 355/77; 361/234

(58) Field of Classification Search .............. 355/53, 355/72, 75, 77; 310/12.05–12.06; 324/658–659, 324/758.01–758.05; 361/234; 414/935–941
See application file for complete search history.

(56) References Cited

U.S. PATENT DOCUMENTS

| | | | |
|---|---|---|---|
| 6,075,375 A | 6/2000 | Burkhart | |
| 6,377,060 B1 | 4/2002 | Burkhart | |
| 7,110,090 B2 | 9/2006 | Neerhof | ........................ 355/72 |
| 7,190,437 B2 | 3/2007 | Butler et al. | ................... 355/69 |
| 7,245,357 B2 | 7/2007 | Van Zwet | |
| 2005/0093378 A1* | 5/2005 | Ohishi | ........................... 310/12 |
| 2005/0128459 A1* | 6/2005 | Zwet et al. | ...................... 355/72 |
| 2006/0114443 A1* | 6/2006 | Takita | .............................. 355/72 |
| 2006/0215144 A1* | 9/2006 | Shibazaki | ....................... 355/72 |
| 2006/0219962 A1* | 10/2006 | Danes et al. | ................... 250/577 |

FOREIGN PATENT DOCUMENTS

| | | |
|---|---|---|
| JP | 04-357851 | 12/1992 |
| JP | 07-007074 | 1/1995 |
| JP | 09-330975 | 12/1997 |
| JP | 11-121320 | 4/1999 |

(Continued)

OTHER PUBLICATIONS

Bart et al. "Micromachined Devices and Fabrication technologies"; Wiley Encyclopedia of Electrical and Electronics Engineering 1999, pp. 648-665.*

(Continued)

*Primary Examiner* — Hung Henry Nguyen
*Assistant Examiner* — Colin Kreutzer
(74) *Attorney, Agent, or Firm* — Pillsbury Winthrop Shaw Pittman LLP

(57) ABSTRACT

A lithographic apparatus includes a movable table constructed and arranged to transport an object to a position in a beam path in a vacuum chamber, a first capacitor electrode and a second capacitor electrode attached to the table, a first inductor assembly coupled to the capacitor electrodes, and configured to apply a voltage between the first capacitor electrode and the second capacitor electrode, and a second inductor assembly mounted at a position that remains fixed when the table is moved. The second inductor assembly is configured to generate a magnetic field. The presence of the object on the table is detected by applying a voltage on the second inductor assembly which will result in a magnetic field which when picked up by the first inductor assembly will create a magnetic field response in the first inductor assembly dependent on the capacitance of the capacitor electrodes.

19 Claims, 4 Drawing Sheets

FOREIGN PATENT DOCUMENTS

| | | | |
|---|---|---|---|
| JP | 11-214482 | | 8/1999 |
| JP | 11214482 A | * | 8/1999 |
| JP | 11-309123 | | 11/1999 |
| JP | 2000-082658 | | 3/2000 |
| JP | 2002-505036 | | 2/2002 |
| JP | 2003-037157 | | 2/2003 |
| JP | 2004-047982 | | 2/2004 |
| JP | 2004-165198 | | 6/2004 |
| JP | 2004165198 A | * | 6/2004 |
| JP | 2005-172503 | | 6/2005 |
| JP | 2005-175173 | | 6/2005 |
| JP | 2005-175176 | | 6/2005 |
| JP | 2005-259789 | | 9/2005 |
| JP | 2006-128203 | | 5/2006 |
| JP | 2007-514325 | | 5/2007 |
| WO | WO 2005048325 A1 | * | 5/2005 |

OTHER PUBLICATIONS

Notice of Reasons for Rejection as issued for Japanese Patent Application No. 2008-148791, dated Feb. 1, 2011.

* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a co-pending application by the same assignee, published as United States Patent Application Publication No. 2005/0128459, a presence detector is described for detecting the presence of a substrate in a lithographic apparatus. The presence detector uses a capacitance measurement. The presence detector comprises a first and second capacitor plate located next to each other in the same plane. When a substrate is placed facing the plates, a series capacitance is formed between the plates, including a first capacitance from the first plate to the substrate and a second capacitance from the substrate to the second plate. In the absence of the substrate, the capacitance between the first and second plates is much lower, as the plates do not face each other. The difference in capacitance with and without the substrate is used to detect the presence of the substrate.

It is desirable to use such a presence detector on a robot in a high vacuum part of a lithographic apparatus. However, the wiring used to connect the plates to the electronics that process sensing signals may outgas, which may compromise the vacuum. Wiring with low outgassing may not be sufficiently flexible for connection to a movable part of a robot for transporting the substrate. This may also apply to other objects that are to be moved through the lithographic apparatus, such as substrates, such as reticles, numerical aperture discs, and sigma blend discs.

U.S. Pat. No. 7,190,437 discloses a lithographic apparatus in which a magnetic field is used for wireless power and information transmission in a vacuum space of the apparatus. The waveform of the magnetic field itself is not used to perform detection of substrates or other objects.

SUMMARY

It is desirable to provide for a lithographic apparatus in which an object on a movable transporter in a vacuum space may be detected without compromising the vacuum.

According to an aspect of the invention, there is provided a lithographic apparatus that includes a projection system constructed and arranged to project a beam of radiation, a vacuum chamber containing at least part of a path of the beam, a movable table constructed and arranged to transport an object to a position in the beam path in the vacuum chamber, a first capacitor electrode and a second capacitor electrode attached to the table, and a first inductor assembly coupled to the first capacitor electrode and the second capacitor electrode, and configured to apply a voltage between the first capacitor electrode and the second capacitor electrode. The lithographic apparatus also includes a second inductor assembly mounted at a position that remains fixed when the table is moved. The second inductor assembly is configured to generate a magnetic field. The presence of the object on the table is detected by applying a voltage on the second inductor assembly which will result in a magnetic field which when picked up by the first inductor assembly will create a magnetic field response in the first inductor assembly dependent on the capacitance of the capacitor electrodes and therefore the presence of the object on the table.

According to an aspect of the invention, there is provided a device manufacturing method that includes moving an object on a table to a position in a beam path in a vacuum chamber, and picking up a magnetic field adjacent the table with a first inductor assembly and applying a voltage with a waveform that follows the waveform of the magnetic field. The voltage is generated with the picked up magnetic field between a first capacitor electrode and a second capacitor electrode attached to the table. The method also includes inducing variations of the magnetic field with the first inductor assembly, dependent on current flowing between the first capacitor electrode and the second capacitor electrode, and inducing the magnetic field adjacent the table at least partly from a second inductor assembly mounted at a position that remains fixed when the table is moved. Magnetic field lines generated by current through the first inductor assembly affects the magnetic field. The method further includes picking up the variations induced by the first inductor assembly with the second inductor assembly.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
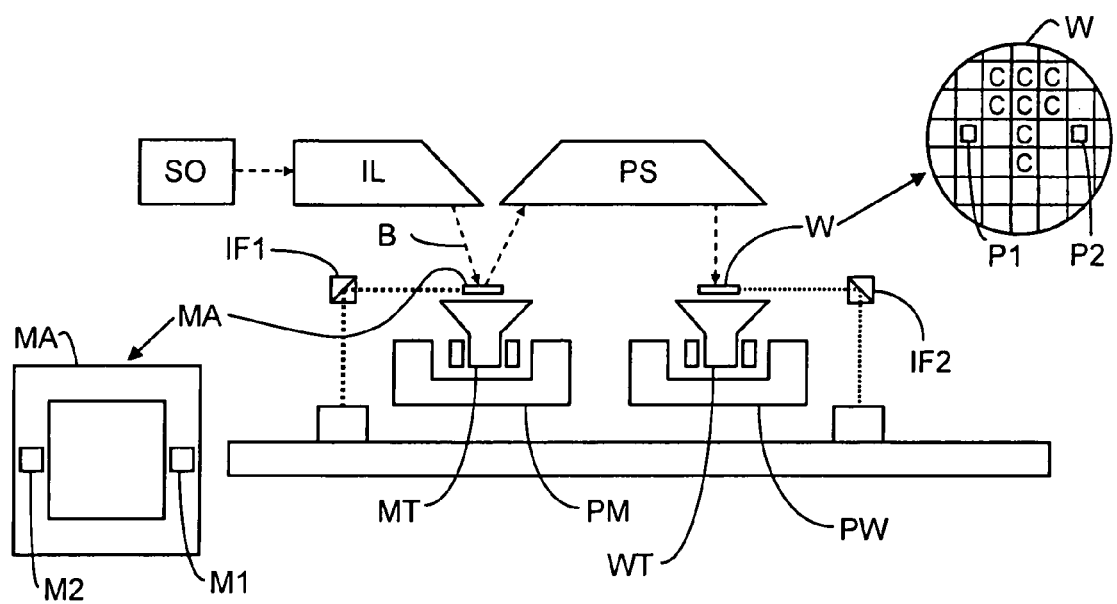
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
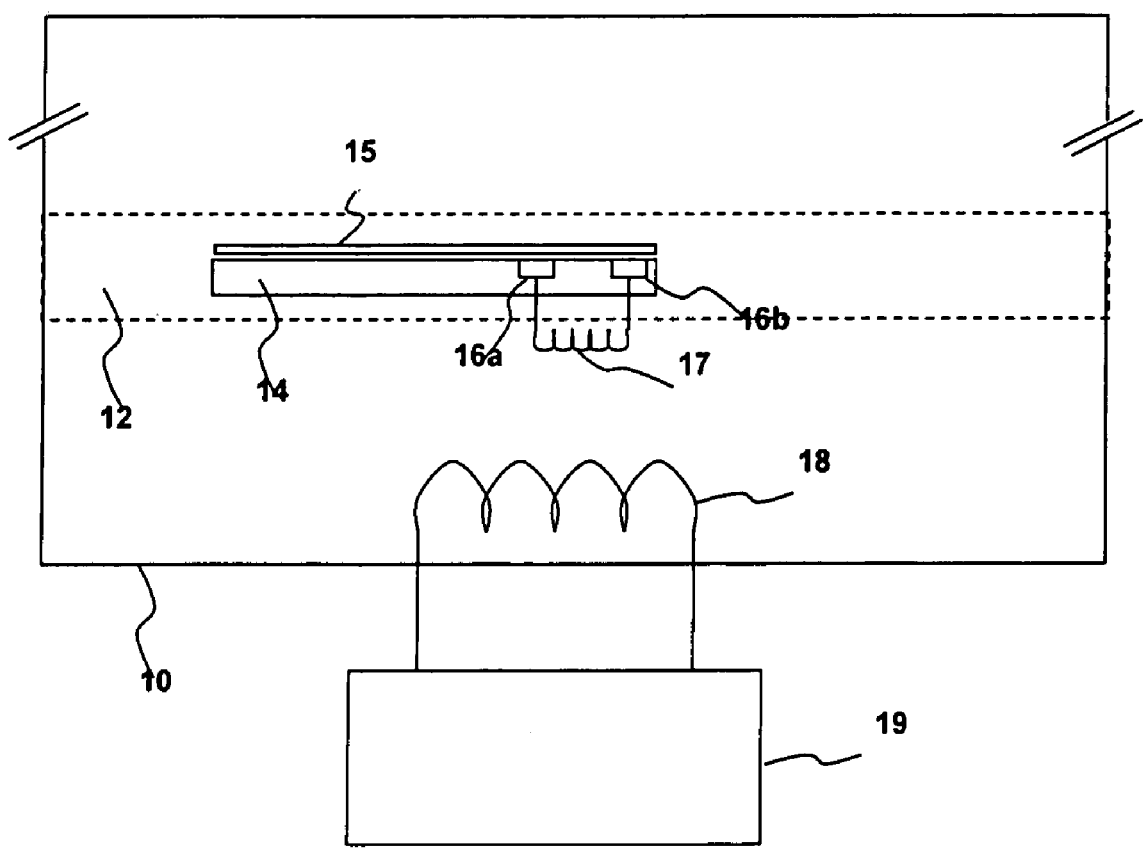
FIG. 2 shows an embodiment of a substrate transport arrangement of the apparatus of FIG. 1.

FIG. 2 shows a vacuum vessel 10 with a transport motor 12 with a substrate table 14 attached to it. Vacuum vessel 10 encloses a vacuum space in which the beam of radiation is projected onto substrates. Transport motor 12 may be any motor used to transport substrates. In an embodiment, transport motor 12 serves to transport substrates to and/or from a location where the beam will be projected onto the substrate. A similar arrangement may be used for reticle (mask) tables instead of the substrate table, or other transport tables, such as tables for NA discs or sigma blend discs.

By way of example a substrate 15 is shown on a table 14. The table 14 comprises a first capacitor electrode 16a and a second capacitor electrode 16b, lying in a common plane that faces the substrate 15. The first capacitor electrode 16a and the second capacitor electrode 16b may be of any suitable configuration, such as a plate. A first inductor winding 17 on table 14 couples the first capacitor electrode 16a and the second capacitor electrode 16b. A second inductor winding 18 is provided on a wall of vacuum vessel. Second inductor winding 18 is coupled to electronic processing circuit 19.

In operation, electronic processing circuit 19 generates a primary electric AC current through second inductor winding 18. This causes a magnetic field, which induces a voltage between the terminals of first inductor winding 17 and thereby between the first capacitor electrode 16a and the second capacitor electrode 16b. This results in a secondary electric current through the circuit formed by first inductor winding 17 and the first capacitor electrode 16a and the second capacitor electrode 16b. The secondary electric current depends on the inductance value of the first inductor winding 17 and the capacitance value between the first capacitor electrode 16a and the second capacitor electrode 16b. The secondary electric current through first inductor winding 17 leads to a magnetic field that affects the voltage across second inductor winding 18.

Thus, the electric impedance between the terminals of second inductor winding 18 depends on the capacitance value between the first capacitor electrode 16a and the second capacitor electrode 16b. The capacitance value between the first capacitor electrode 16a and the second capacitor electrode 16b depends on the presence or absence of the substrate 15 on the table 14. For determining the capacitance value, the substrate 15 may be regarded as a conductive plate. When substrate 15 is present, respective capacitors are formed between the first capacitor electrode 16a and the substrate 15 and between the substrate 15 and the second capacitor electrode 16b. Thus, the capacitance between the first capacitor electrode 16a and the second capacitor electrode 16b is mainly determined by a series connection of these two capacitor electrodes. When the substrate is absent, the capacitance is formed due to the electric field from first capacitor electrode 16a to the second capacitor electrode 16b. This capacitance is much smaller than the capacitance in the presence of the substrate 15, because the first capacitor electrode 16a and the second capacitor electrode 16b do not face each other.

Electronic processing circuit 19 measures a parameter that is representative of the impedance between the terminals of the second inductor winding 18, for example, by using a measurement of the current through a circuit that contains the second inductor winding 18 in response to an applied voltage. Electronic processing circuit 19 compares the measured parameter with a threshold to distinguish between the presence and absence of the substrate 15. Dependent on the result of the comparison, electronic processing circuit 19 initiates further actions of the lithographic apparatus, such as a renewed placement of a substrate on table 14, or a recovery action for a fallen substrate. Electronic circuits for measuring a parameter that is representative of the impedance and for comparing parameters with thresholds are known. Therefore, the electronic processing circuit 19 will not be described in more detail.

In an embodiment, a more complex inductor assembly may be used, with separate windings to pick up magnetic fields and to generate magnetic fields, either instead of an inductor assembly with a single first inductor with first inductor winding 17 or instead of an inductor assembly with a single second inductor second inductor winding 18, or both. In each case, the picked-up field is passed to the capacitor electrodes, so that the waveforms of the voltage between the capacitor electrodes follows the magnetic field, with the same frequency and possibly with a modified amplitude or phase. The same arrangement is used for the signal passed back from the capacitor electrodes. When such a compound inductor assembly is used instead of an inductor assembly with a single inductor with second inductor winding 18, it suffices to measure induced voltage or current from the pick-up windings, and a parameter representative of the impedance of second inductor winding 18 is not needed.

In an embodiment, electronic processing circuit 19 is configured to apply an AC current with an AC frequency at a frequency at or near a resonance frequency of a resonance determined by the capacitance value between the first capacitor electrode 16a and the second capacitor electrode 16b in the absence or presence of the substrate 15. The inductance L formed by first inductor winding 17 and the capacitance C between the first capacitor electrode 16a and the second capacitor electrode 16b, with a resonance frequency proportional to the square root of the product L*C. As a result, the impedance across the terminals of second inductor winding 18 at such a frequency is strongly dependent on the presence or absence of the substrate 15, which may make it easier to measure the effect of presence and absence of the substrate 15. In an embodiment, electronic processing circuit 19 measures the frequency dependence of the impedance, to detect a resonance frequency at which a positive or negative resonance peak occurs, and compares this resonance frequency with a threshold to form a detection of the substrate 15.

In an embodiment, the first capacitor electrode 16a and the second capacitor electrode 16b, which are electrically conductive, are each provided with a layer of electrically insulating coating on the surface between the electrically conductive part and the substrate 15. The thickness of such an electrically insulating coating layer may be kept very thin. Silicon oxide or aluminum oxide may be used in the coating layer, for example. Polymer coatings that may have outgassing effects on the vacuum are note typically used. If table 14 has electrically conductive parts, a spacing may be provided between the first capacitor electrode 16a and the second capacitor electrode 16b and the conductive parts of the table, the spacing distance being selected so that the capacitance from each capacitor electrode 16a, 16b to the conductive part of table 14 is smaller than the capacitance to the substrate 15. The spacing may be filled with electrically insulating material. In an embodiment, the table 14 may be divided into electrically separate conductive parts that function as respective capacitor electrodes.

In an embodiment, second inductor winding 18 is supported by a wall of vacuum vessel 10 (e.g. by its floor, which is considered to be one of the walls). However, any other support that does not move together with table 14 may be used. Second inductor winding 18 will typically be located inside the vacuum vessel 10. But if vacuum vessel has a non-conductive wall part, second inductor winding 18 may also be located outside vacuum vessel 10. Although first and second inductor windings 17, 18 have been shown as single coils, it should be appreciated that compound structures may be used. For example, a transformer may be added between first inductor windings 17 and the capacitor electrodes 16a, 16b, or a midpoint tap of first inductor windings 17 may be coupled to a body of the table 14. When a transformer is used, the resonance frequency need not depend significantly on the inductance of first inductor windings 17, but this does not affect the detectability of resonance frequency changes.

Figure 3:
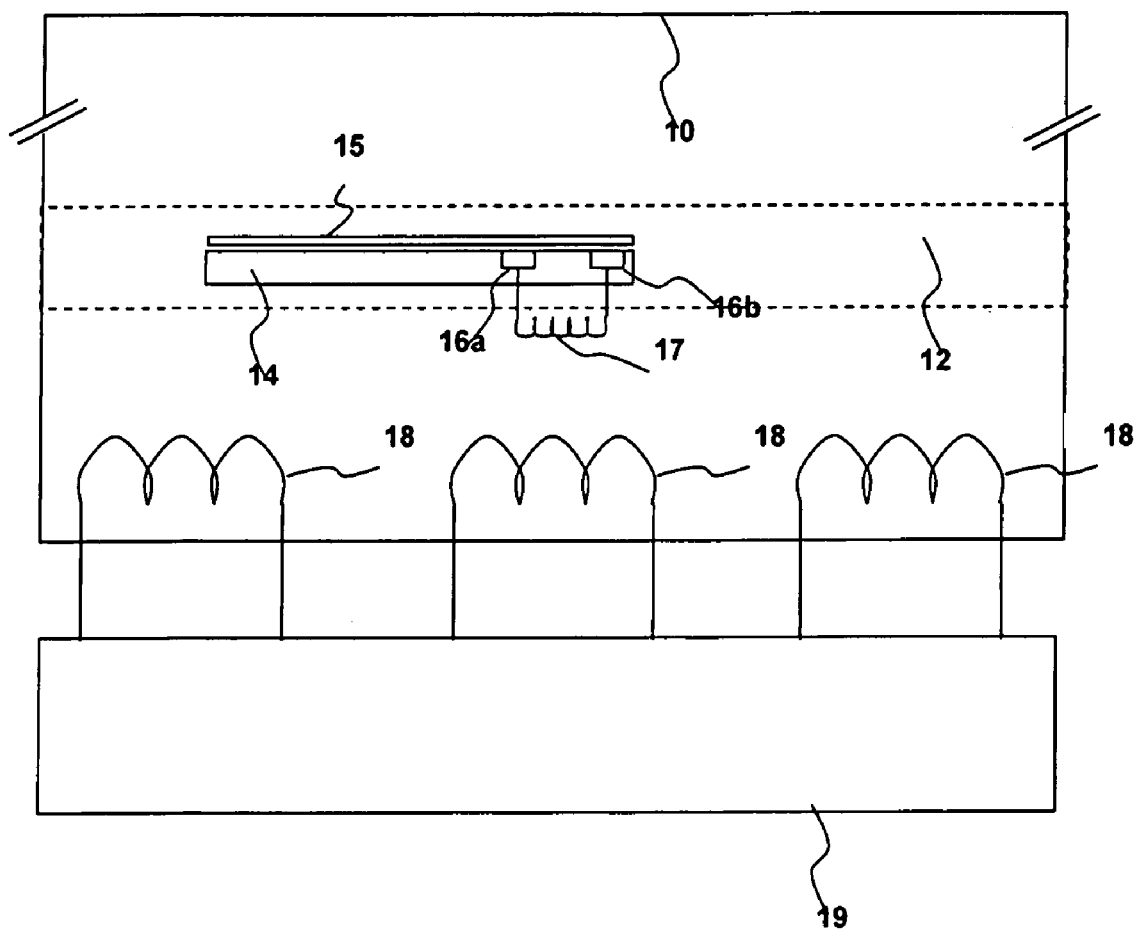
FIG. 3 shows an embodiment of the substrate transport arrangement of the apparatus of FIG. 1.

FIG. 3 shows an embodiment in which a plurality of second inductor windings 18, each with terminals coupled to electronic circuit 19, is provided. Second inductor windings 18 are positioned at successive positions along a transport path of table 14. In this embodiment, electronic circuit 19 determines parameters that are representative of the impedance between the terminals of each of second inductor windings 18, and detects presence of substrate 15 if any one of the second inductor windings 18 exhibits a resonance at a frequency corresponding to presence of substrate 15.

Figure 4:
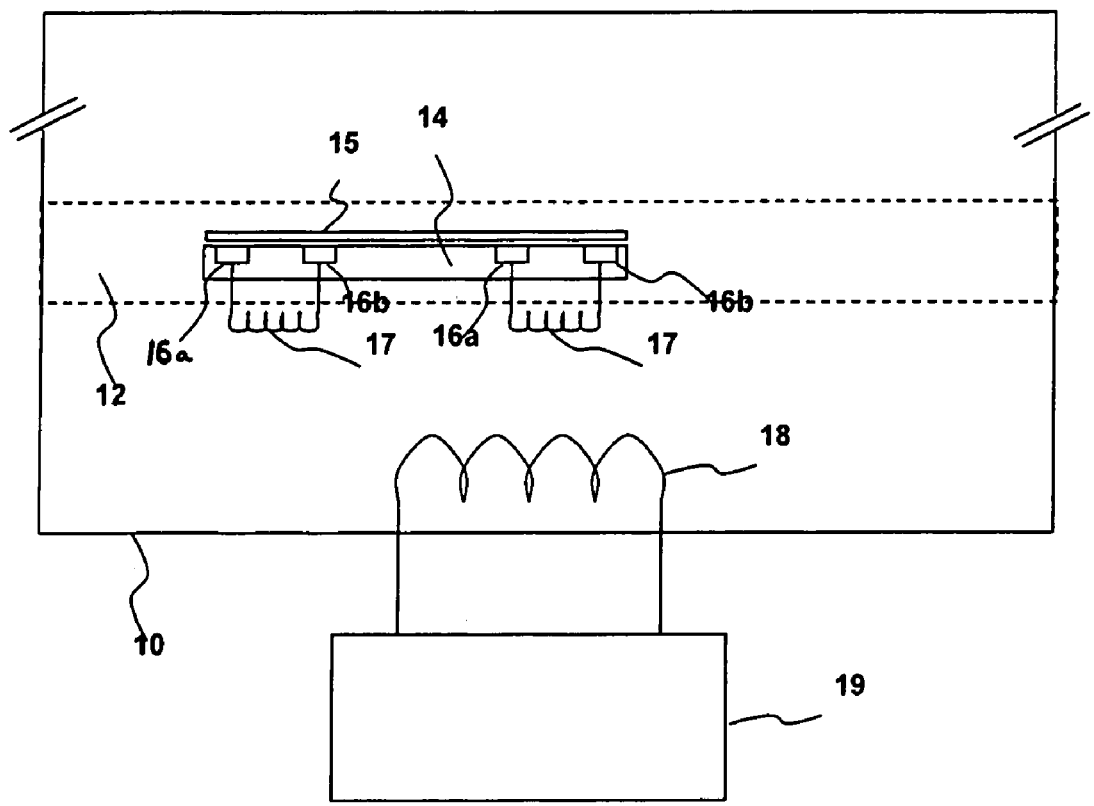
FIG. 4 shows an embodiment of the substrate transport arrangement of the apparatus of FIG. 1.

FIG. 4 shows an embodiment in which a plurality of assemblies of a first inductor winding 18 coupled between corresponding first and second capacitor electrodes 16a, 16b are provided on a single table 14. Here, the size of the capacitor electrodes 16a, 16b, the thickness of a coating on the capacitor electrodes and/or an inductance value of first inductor winding 18 is made different in different ones of the assemblies, so that the resonance frequencies of different ones of the assemblies are mutually different in the presence of substrate 15 over the capacitor electrodes 16a, 16b. This makes it possible to detect whether substrate is positioned covering each set of capacitor electrodes. By way of example, two assemblies are shown, but more may be used. In this embodiment, electronic circuit 19 determines whether resonance peaks of each of the assemblies occur in respective frequency ranges corresponding to presence of substrate 15 for respective ones of the assemblies. In an embodiment, one or more of the assemblies may be provided at locations where substrate 15 should not normally be. In this case, erroneous positioning of the substrate may be detected from the frequency of the resonance. In an embodiment, the first inductor windings of a plurality of the assemblies are all coupled to a common pick-up coil, for example, via a transformer. In this case, the common pick-up coil picks up a magnetic field and generates response fields from and for second inductor windings for all assemblies.

Although embodiments have been shown in which the presence of a substrate 15 on a table is detected, it should be appreciated that presence of a reticle (mask) instead of the substrate can be detected in the same way on appropriate tables. The lithographic apparatus may have a detector for a reticle and/or a detector for a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a projection system constructed and arranged to project a beam of radiation;
    a vacuum chamber containing at least part of a path of the beam;
    a movable table constructed and arranged to transport an object to a position in the beam path in the vacuum chamber;

a first capacitor electrode and a second capacitor electrode attached to the table;

a plurality of first inductor assemblies positioned along a path of movement of the movable table, each first inductor assembly configured to have a different inductance value such that the resonance frequencies of different ones of the plurality of first inductor assemblies are mutually different in the presence of the object over the first and second capacitor electrodes, wherein a first inductor assembly of the plurality of first inductor assemblies coupled to the first capacitor electrode and the second capacitor electrode, and configured to apply a voltage between the first capacitor electrode and the second capacitor electrode; and a second inductor assembly mounted at a position that remains fixed, the second inductor assembly being configured to generate a magnetic field, wherein the presence of the object on the table is detected by applying a voltage on the second inductor assembly which will result in a magnetic field which when picked up by the first inductor assembly will create a magnetic field response in the first inductor assembly dependent on the capacitance of the capacitor electrodes and therefore the presence of the object on the table.

2. A lithographic apparatus according to claim 1, further comprising an electronic processing circuit coupled to terminals of the second inductor assembly, and configured to measure an effect of variations in the magnetic field induced by the first inductor assembly.

3. A lithographic apparatus according to claim 2, wherein the electronic processing circuit is configured to measure a resonance frequency of a resonance effect caused by a resonant circuit comprising a capacitance formed with the first capacitor electrode and the second capacitor electrode.

4. A lithographic apparatus according to claim 2, wherein the second inductor assembly comprises an inductor winding, the electronic processing circuit being configured to apply a current through the inductor winding to generate the magnetic field and to measure an effect of the magnetic field picked up by the inductor winding.

5. A lithographic apparatus according to claim 1, further comprising a plurality of pairs of first and second capacitor electrodes, each pair being attached to the table and coupled to the first inductor assembly.

6. A lithographic apparatus according to claim 1, wherein the first inductor assembly comprises an inductor coupled between the first capacitor electrode and the second capacitor electrode.

7. A lithographic apparatus according to claim 1, wherein the table is configured to transport the object to or from a position where it receives the beam of radiation.

8. A lithographic apparatus according to claim 1, wherein the table is configured to transport the object to or from a position where the object is used to pattern the beam of radiation.

9. A lithographic apparatus according to claim 1, wherein the first capacitor electrode comprises a first plate and the second capacitor electrode comprises a second plate.

10. A lithographic apparatus according to claim 1, wherein the first capacitor electrode and the second capacitor electrode are part of the table.

11. A lithographic apparatus according to claim 1, wherein the first inductor assembly is configured to generate a voltage having a waveform that follows a waveform of the magnetic field picked up in the first inductor assembly.

12. A lithographic apparatus according to claim 1, wherein the second inductor assembly is configured to pick up the magnetic field response in the first inductor assembly.

13. A lithographic apparatus according to claim 1, wherein the second inductor assembly comprises a first inductor winding to generate the magnetic field and a second inductor winding to pick up the magnetic field response in the first inductor assembly.

14. A lithographic apparatus according to claim 1, wherein the first inductor assembly comprises a first inductor winding to create the magnetic field response and a second inductor winding to pick up the magnetic field generated by the second inductor assembly.

15. A lithographic apparatus according to claim 1, further comprising an electronic processing circuit which is configured to apply an AC current with an AC frequency at a frequency at or near a resonance frequency of a resonance determined by a capacitance value between the first capacitor electrode and the second capacitor electrode in the absence or presence of the object.

16. A lithographic apparatus according to claim 1, further comprising an electronic processing circuit which measures frequency dependence of an impedance across terminals of the second inductor assembly to detect a resonance frequency at which a positive or negative resonance peak occurs and compares the resonance frequency with a threshold to detect presence of the object.

17. A lithographic apparatus according to claim 1, wherein the plurality of first inductor assemblies positioned along the path of movement of the table such that at least one inductor assembly being provided at a location where the object should not normally be.

18. A lithographic apparatus comprising:

a projection system constructed and arranged to project a beam of radiation;

a vacuum chamber containing at least part of a path of the beam;

a movable table constructed and arranged to transport an object to a position in the beam path in the vacuum chamber;

a first capacitor electrode and a second capacitor electrode attached to the table:

a first inductor assembly coupled to the first capacitor electrode and the second capacitor electrode, and configured to apply a voltage between the first capacitor electrode and the second capacitor electrode;

an electronic processing circuit;

a plurality of second inductor assemblies, each with terminals coupled to the electronic processing circuit and being positioned along a path of movement of the table, each second inductor assembly being mounted at a respective position that remains fixed, wherein each second inductor assembly of the plurality of second inductor assemblies being configured to generate a magnetic field in response to applying a voltage on the second inductor assembly which will result in a magnetic field which when picked up by the first inductor assembly will create a magnetic field response in the first inductor assembly dependent on the capacitance of the capacitor electrodes, wherein the electronic processing circuit determines parameters that are representative of an impedance across terminals of each of the plurality of second inductor assemblies to detect presence of the object if any one of the plurality of second inductor assemblies exhibits a resonance at a frequency corresponding to presence of the object.

19. A device manufacturing method comprising:

moving an object on a table to a position in a beam path in a vacuum chamber by using a plurality of first inductor assemblies positioned along a path of movement of the table, each first inductor assembly configured to have a different inductance value such that the resonance frequencies of different ones of the plurality of first inductor assemblies are mutually different in the presence of the object over first and second capacitor electrodes attached to the table, wherein a first inductor assembly of the plurality of first inductor assemblies coupled to the first capacitor electrode and the second capacitor electrode;

picking up a magnetic field adjacent the table with the first inductor assembly and applying a voltage with a waveform that follows the waveform of the magnetic field, said voltage being generated with the picked up magnetic field between the first capacitor electrode and the second capacitor electrode;

inducing variations of the magnetic field with the first inductor assembly, dependent on current flowing between the first capacitor electrode and the second capacitor electrode;

inducing the magnetic field adjacent the table at least partly from a second inductor assembly mounted at a position that remains fixed, wherein magnetic field lines generated by current through the first inductor assembly affects the magnetic field; and picking up the variations induced by the first inductor assembly with the second inductor assembly.

* * * * *